US006690242B2

(12) United States Patent
Fang et al.

(10) Patent No.: US 6,690,242 B2
(45) Date of Patent: Feb. 10, 2004

(54) DELAY CIRCUIT WITH CURRENT STEERING OUTPUT SYMMETRY AND SUPPLY VOLTAGE INSENSITIVITY

(75) Inventors: Lieyi Fang, Plano, TX (US); Charles M. Branch, Frisco, TX (US); Kuok Young Ling, Calabasas, CA (US); Feng Ying, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/059,626

(22) Filed: Jan. 29, 2002

(65) Prior Publication Data

US 2003/0117202 A1 Jun. 26, 2003

Related U.S. Application Data

(60) Provisional application No. 60/343,115, filed on Dec. 21, 2001.

(51) Int. Cl.[7] .............................................. H03B 27/00
(52) U.S. Cl. .................... 331/57; 331/116 FE; 327/256
(58) Field of Search ............................. 331/57, 116 FE, 331/175; 327/256, 280, 281, 287, 288

(56) References Cited

U.S. PATENT DOCUMENTS 6,348,839 B1 * 2/2002 Aramaki ...................... 331/57

6,469,585 B1 * 10/2002 Dai et al. ..................... 331/57
2001/0002115 A1 * 5/2001 Hwang et al. ................ 331/17

OTHER PUBLICATIONS

Ali Hajimiri, Sotirios Limotyrakis, and Thomas H. Lee, "Jitter and Phase Noise in Ring Oscillators," *IEEE Journal Of Solid–State Circuits*, vol. 34, No. 6, pp. 790–804, Jun. 1999.

Ali Hajimiri, "A General Theory of Phase Noise in Electrical Oscillators," *IEEE Journal Of Solid–State Circuits*, vol 33, No. 2, pp. 179–194, Feb. 1998.

* cited by examiner

*Primary Examiner*—Henry Choe
(74) *Attorney, Agent, or Firm*—W. Daniel Swayze, Jr.; W. James Brady; Frederick J. Telecky, Jr.

(57) ABSTRACT

A circuit for providing a symmetrical output signal to a communication system. The circuit includes an input circuit (22 and 24) for receiving an input signal and a symmetry circuits (205 and 210) advantageously configured to provide an output signal exhibiting a symmetrical rising and falling edge waveform in response to the received input signal. An integrated power source ($I_s$) provides current to a common node (N1) in which current is advantageously steered to each half circuit (22, 205 and 24, 210) to reduce voltage variation on the common node during voltage transition of the input signal, hence, reducing current fluctuation from the current source.

6 Claims, 1 Drawing Sheet

DELAY CIRCUIT WITH CURRENT STEERING OUTPUT SYMMETRY AND SUPPLY VOLTAGE INSENSITIVITY

This application claims the benefit of provisional application No. 60/343,115 filed Dec. 12, 2001.

BACKGROUND OF THE INVENTION

1. Technical Field of the Invention

The present invention relates generally to the field of integrated circuits and, more particularly, to oscillator delay cells.

2. Description of Related Art

Controlled ring oscillators are common building blocks in most communication systems, especially in applications such as phase locked loops, clock generations and clock distributions. The frequency of operation, jitter or phase noise, tuning range and frequency stability with temperature, supply voltage variation are typical characteristics which must be considered when designing oscillators. Differential ring oscillators, in particular, offer a key advantage of being integratable on a chip without external components, which becomes very important for applications where space is very limited. LC oscillator or crystal oscillators generally provide low jitter or phase noise, but also generally require external chip components. Some disadvantages of typical CMOS differential ring oscillators include a relatively lower phase noise performance and the increased sensitivity to supply voltage change when compared to LC oscillator or a crystal oscillator.

In general, a differential ring oscillator is comprised of several cascaded stages of identical differential delay cells connected in such a manner as to provide an effective phase inversion allowing oscillation. Typically, these stages are used to provide the instability and feedback necessary for oscillation. The amount of jitter or phase noise in a ring oscillator is determined by the nature of the differential delay cells and the biasing tail currents, particularly in a low power application. To reduce the overall jitter and phase noise of a ring oscillator, care must be taken to ensure that each differential delay cell contributes minimal noise. Furthermore, the device noise of each tail current transistor is also a considerable source of jitter, particularly, in extra low power applications.

Therefore, there is a need for a differential delay cell which reduces or eliminates phase, jitter, and/or flicker noise for use in ring oscillators, PLL, DLL, and other communication systems, in low power applications.

SUMMARY OF THE INVENTION

The present invention achieves technical advantages as a circuit for providing a symmetrical signal to a communication system which can be integrated in oscillator type circuits, for example. In one embodiment, the circuit includes a pair of half circuits having respective inputs for receiving a differential signal pair, and a pair of symmetry circuits coupled to the half circuits and advantageously configured to provide an output signal exhibiting a symmetrical waveform in response to the received differential input signal. The circuit further enables current steering to each half circuit to advantageously reduce voltage variation on a common node, hence, reducing current fluctuation from a current source.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others.

Oscillators may occur in many forms. The simplest form of an oscillator is an amplifier with positive feedback. This type of oscillator is one which generates a signal where the output voltage oscillates, meaning that it swings up and down in a regular pattern or wave such as a sine wave, for example. A ring type oscillator generally includes a plurality of stages or differential delay cells connected in a ring configuration as is known in the art. In operation, the outputs of the first differential delay cell act as inputs to the next delay cell, and so on.

By studying the impulse response of an oscillator it can be seen that upconversion of $1/f$ noise can be managed by designing a differential cell which operates to give a symmetrical rising and falling waveform on the outputs of the individual delay cells. For a more detailed discussion of noise in oscillators, reference can be made to, A. Hajimiri and T. H. Lee, "A general theory of phase noise in electrical oscillators," IEEE JSSC, 33(2): 179–194, 1998 and A. Hajimir, S. Limatyrakis, and T. H. Lee, "Jitter and phase noise in ring oscillator," IEEE JSSC, 34(6): 790–804, 1999, the descriptions of which are incorporated herein by reference.

Figure 1:
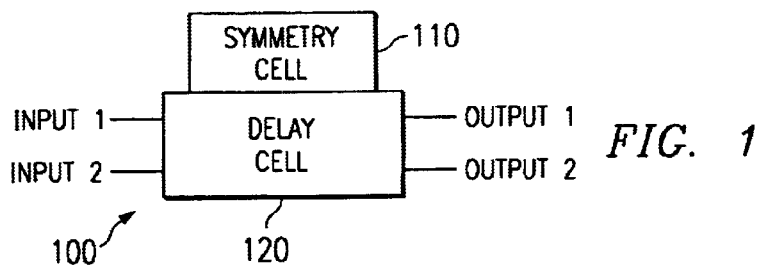
FIG. 1 illustrates a block diagram of a differential current steering delay cell in accordance with an exemplary embodiment of the present invention.

Referring now to FIG. 1 there is illustrated a block diagram of a differential current steering delay cell 100, in accordance with an exemplary embodiment of the present invention, including an inverting delay cell 120 and a symmetry cell 110. The inverting delay cell 120 is operable to receive a differential input signal (input1 and input2) and outputs inverted delayed signals (output1 and output2) in response to the received input signal in which output1 corresponds to input1 and output2 corresponds to input2. In operation, assuming the first differential input signal input1 is logic high and the second differential input signal input2 is logic low, positive output signal output1 is low and negative output signal output2 is high. There is a propagation delay time between the input signals input1 and input2 and the output signals output1 and output2. Assuming the first differential input signal input1 is low and the second differential input signal input2 is high, the positive output signal output1 becomes high and the negative output signal output2 becomes low, and there is again a propagation delay time between the input and output signals.

A typical technique for noise reduction is to increase the supply current, however, low power designs simply cannot supply the larger noise reduction currents necessary for this method of noise reduction. The symmetry cell 110 can operate to reduce noise in low power designs for a given supply current.

The symmetry cell 110 is electrically coupled to the inverting delay cell 120 forming an integrated pair of circuits connected at a common mode node. The circuit pair includes an input for receiving a differential input signal (input1 and input2) and an output for outputting a delayed differential signal (output1 and output2) responsive to the input signal. The symmetry cell 110 is configured to provide symmetry to the rising and falling edges of the differential output signal (output1 and output2) waveform produced by the delay cell 120. A symmetrical waveform advantageously reduces or eliminates the low-frequency-noise ($1/f$) upconversion in a time-varying phase-noise model.

Additionally, the symmetry cell 110 is configured to advantageously steer the current into the circuit pair to reduce the voltage variation on the common mode node. Reduced voltage variation on the common mode node consequently reduces kickback which operates to reduce or eliminate noise (i.e., current variance) from a transistor type current source.

Figure 2A:
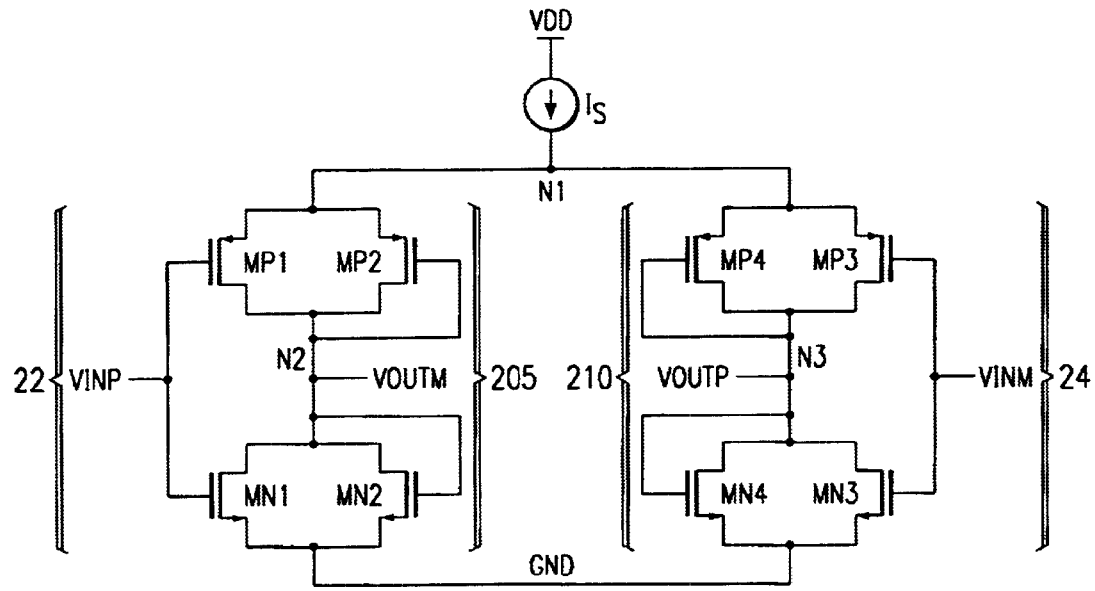
FIG. 2A illustrates a circuit diagram of a differential current delay cell in accordance with an exemplary embodiment of the present invention.

Referring now to FIG. 2A there is illustrated an example of the circuit pair of FIG. 1 in accordance with an exemplary embodiment of the present invention, including input circuits 22 and 24 respectively coupled to symmetry output circuits 205 and 210. Thus, the circuit pair of FIG. 1 is partitioned into half circuits 22, 205 and 24, 210, each half circuit including half (22 or 24) of the delay cell and half (205 or 210) of the symmetry cell. Input circuits 22 and 24 are coupled to respective inputs (corresponding to input1 and input2 in FIG. 1) for receiving differential signals $V_{inp}$ and $V_{inm}$ and output circuits 205 and 210 are coupled to respective outputs (corresponding to output1 and output2 in FIG. 1) for providing differential signals $V_{outm}$ and $V_{outp}$. Additionally, input circuits 22 and 24 are connected to voltage supply VDD through current source $I_s$. The current source $I_s$ can be, for example, a transistor configured to supply a tail current in the micro-ampere range with its source connected to the voltage supply VDD, its drain connected to common mode node N1, and gated by a separate control signal (not explicitly shown.

Regarding input circuit 22, the source of transistor MP1 is connected at common mode node N1 which is a shared node of current source $I_s$. The gate of MP1 is connected to differential input $V_{inp}$ and the drain of transistor MP1 is connected to the drain of transistor MN1 at node N2. The source of MN1 is connected to ground (or power supply) and its gate is coupled to differential input $V_{inp}$. For input circuit 24, the source of transistor MP3 is also connected at N1. The gate of MP3 is connected to differential input $V_{inm}$ and the drain of transistor MP3 is connected to the drain of transistor MN3 at node N3. The source of MN3 is connected to ground and its gate is coupled to differential input $V_{inm}$.

The parallel symmetry output circuits 205 and 210 are connected to the common mode node N1. More specially, for symmetry output circuit 205, the source of transistor MP2 is connected to node N1. The drain and gate of MP2 are connected to node N2. The drain and gate of MN2 are also connected to node N2 and its source is connected to ground. One of the symmetrical differential output signals ($V_{outm}$) is provided at node N2.

For symmetry output circuit 210, the source of transistor MP4 is connected to common mode N1. The drain and gate of MP4 are connected to node N3. The drain and gate of transistor MN4 are also connected to node N3 and its source is connected to ground. The other symmetrical differential output signal ($V_{outp}$) is provided at node N3. There is a propagation delay time between the input signals $V_{inp}$ and $V_{inm}$ and the corresponding responsive output signals $V_{outm}$ and $V_{outp}$. In at least one embodiment, transistors MP1, MP2, MP3, MP4, MN1, MN2, MN3, and MN4 are metal-oxide semiconductor (MOS) transistors. Further, in at least one embodiment, MP1, MP2, MP3 and MP4 are p-channel MOS transistors and MN1, MN2, MN3, and MN4 are n-channel MOS transistors all of which can be integrated as a complementary MOS device.

Jitter and/or phase noise caused by the up-conversion of the low frequency component of the noise is reduced or eliminated by sizing the transistors to enable output signals $V_{outm}$ and $V_{outp}$ with respective waveforms exhibiting symmetrical rising and falling edges. The rising and falling edge on each of the outputs can be symmetrically shaped by choosing equal sizes for the corresponding transistors.

In operation when the input signal level is between a minimum (min) and a midpoint [(max−min)/2+min], the transistors MP1 and MN2 are conducting and the gain is determined approximately by gmp1/gmn2 (gmp1 is the transconductance of MP1 and gmn2 is the transconductance of MN2). When the signal level is between the midpoint and maximum (max), transistors MN1 and MP2 are conducting and the gain is determined approximately by gmn1/gmp2 (gmn1 is the transconductance of MN1 and gmp2 is the transconductance of MP2). The size of the transistors are advantageously selected so that these two gains are similar, therefore, the rising and falling edges of the output signal are approximately symmetrical. The same explanation holds for the other half of the circuit (MN3, MN4, MP3 and MP4). Note, for example, that when MN1 and MP1 are sized to have approximately the same transconductance, and MN2 and MP2 are sized to have approximately the same transconductance, then gmn1/gmp2≈gmp1/gmn2. The gain is, in some embodiments, selected to be as low as possible while guaranteeing the oscillation.

The output voltage swing, of the differential current steering delay cell, is advantageously limited, enabling a limited oscillation magnitude which also enables an oscillation frequency that is insensitive to supply voltage variations. By applying the diode-connected transistors (MN2 and MP2; MN4 and MP4) the output magnitude is limited to the gate-to-source voltage, $V_{gs}$, of the transistors which are not supply dependent. Therefore, the output magnitude and the oscillation frequency are insensitive to the supply voltage. For example, in an operating voltage range of approximately 1.1 to approximately 1.5, simulation results show that for a voltage variation of 10 mV, the oscillation magnitude and oscillation frequency exhibit little or no variations.

Additionally, transistors MP2 and MP4 (which are connected to the common mode node N1) advantageously steer current into each half circuit of the differential delay cell, reducing the voltage variation on N1 and, thereby, reducing the kickback from the delay cell to the current source $I_s$. Consequently, current source fluctuation or noise is reduced.

Kickback from the delay cell causes a modulation of the drain-source voltage ($V_{ds}$) of a transistor current source which, thereby, modulates the current supplied to the delay cell. Delay cells which enable a more constant supply current throughout the period of oscillation further improves the phase-noise characteristics of, for example, an oscillator or clock generator employing the differential delay cell.

In accordance with the present invention, when the input signal level ($V_{inp}$) is between the minimum and midpoint, the transistor MP1 and MN2 conduct on one side and MN3 and MP4 conduct on the other side (since this is a differential circuit, the other input ($V_{inm}$) will be between the midpoint and maximum). During this phase, transistors MN1, MP2, MP3, and MN4 are off. When signal level $V_{inp}$ is between the midpoint and maximum, transistor MN1 and MP2 conduct on one side and MP3 and MN4 conduct on the other side, and transistors MP1, MN2, MN3, and MP4 are off during this phase.

To further illustrate, suppose MP2 and MP4 are not used, during the transition from MP1 conducting (MP3 off) to MP3 conducting (MP1 off), the circuit is not fully conducting. Since there is no flow path for the full tail current, the tail current is reduced by modulating the $V_{ds}$ which in turn disadvantageously modulates the voltage on N1. By adding MP2 and MP4, even during the signal voltage transition, the current can flow through either MP2 or MP4 depending on the transition direction, thus advantageously reducing the tail current variation and hence the voltage on N1. For example, during the transition when MP1 is off and MP3 starts to conduct, the current can flow through MP2. So MP2 and MP4 act to steer the current into each half circuit and make the transition smoother to reduce the voltage variation on N1.

Figure 2B:
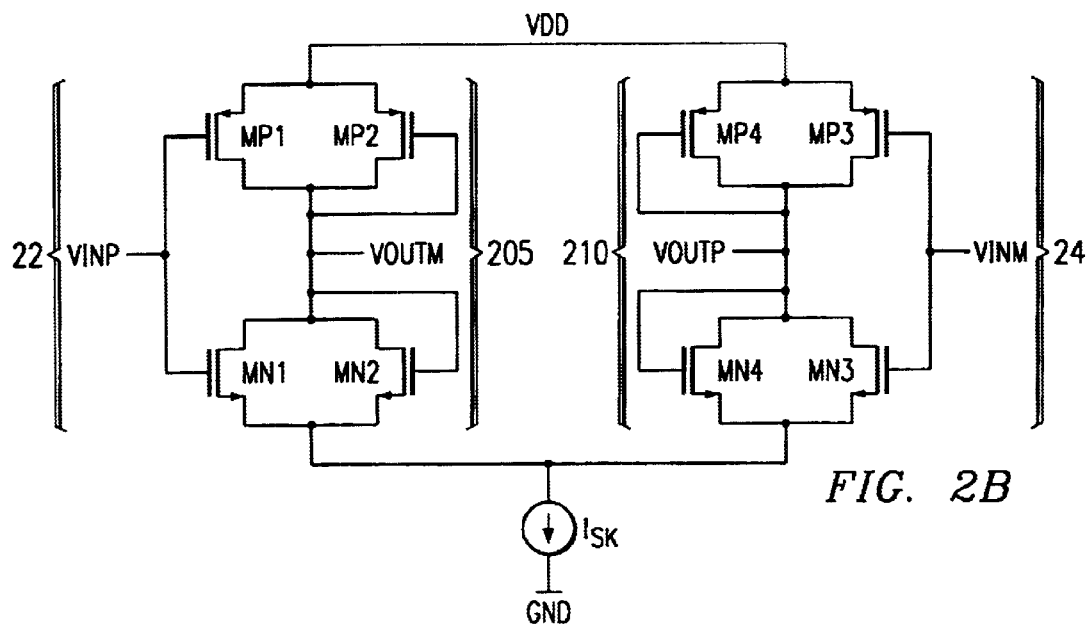
FIG. 2B illustrates a circuit diagram of a differential current delay cell in accordance with an exemplary embodiment of the present invention.

FIG. 2B illustrates another embodiment of a differential current steering delay cell 250 in accordance with the present invention. The transistor circuit arrangement is similar to that of FIG. 2A except for the removal of current source $I_s$ and the addition of the current sink $I_{sk}$ between the input circuits 22 and 24, symmetry output circuits 205 and 210, and ground. All other aspects operate similar to the above description for FIG. 2A.

Although a preferred embodiment of the method and system of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. An apparatus for providing an output signal waveform responsive to an input signal waveform, comprising:
   an input adapted to receive said input signal waveform;
   an output adapted to output said output signal waveform;
   a delay circuit coupled between said input and said output; and
   a symmetry circuit coupled to said delay circuit and cooperable therewith to produce a gain characteristic between said input and said output that provides said output signal waveform with approximately symmetrical rising and falling edges,
   wherein said delay circuit comprises a first MOS transistor and a second MOS transistor coupled to said input, and wherein said symmetry circuit comprises a first MOS transistor and a second MOS transistor coupled to said output,
   wherein said gain characteristic is determined by one of a ratio of a transconductance of said delay circuit first MOS transistor and said symmetry circuit second MOS transistor and a further ratio of a transconductance of said delay circuit second MOS transistor and said symmetry circuit first MOS transistor, and
   wherein said MOS transistors associated with said ratio are sized to provide approximately equal transconductance and said MOS transistors associated with said further ratio are sized to provide approximately equal transconductance.

2. An apparatus for providing an output signal waveform responsive to an input signal waveform, comprising:
   an input adapted to receive said input signal waveform;
   an output adapted to output said output signal waveform;
   a delay circuit coupled between said input and said output; and
   a symmetry circuit coupled to said delay circuit and cooperable therewith to produce a gain characteristic between said input and said output that provides said output signal waveform with approximately symmetrical rising and falling edges,
   wherein said delay circuit comprises a first MOS transistor and a second MOS transistor coupled to said input, and wherein said symmetry circuit comprises a first MOS transistor and a second MOS transistor coupled to said output, and
   wherein said delay circuit first MOS transistor includes a gate coupled to said input, a source coupled to a common node, and a drain coupled to said output, and said delay circuit second MOS transistor includes a gate coupled to said input, a source coupled to a power supply and a drain coupled to said output, and wherein said symmetry circuit first MOS transistor includes a source coupled to said common node and a gate and drain coupled to said output, and said symmetry circuit second MOS transistor includes a source coupled to said power supply and a gate and drain coupled to said output.

3. The apparatus of claim 2, wherein said gain characteristic is determined by said ratio and said further ratio, and wherein said ratio is determinative when said input signal waveform is between a minimum voltage and a midpoint voltage and said further ratio is determinative when said input signal waveform is between said midpoint voltage and a maximum voltage.

4. The apparatus of claim 2 further including a current source coupled to said delay circuit and said symmetry circuit at a common node and operable to supply a current.

5. The apparatus of claim 2, wherein said delay circuit and said symmetry circuit are further cooperable to provide said output signal waveform with a magnitude that is insensitive to a variaton in operating voltage for said delay circuit and said symmetry circuit.

6. An apparatus for providing an output signal waveform responsive to an input signal waveform, comprising:
   an input adapted to receive said input signal waveform;
   an output adapted to output said output signal waveform;
   a delay circuit coupled between said input and said output; and
   a symmetry circuit coupled to said delay circuit and cooperable therewith to produce a gain characteristic between said input and said output that provides said output signal waveform with approximately symmetrical rising and falling edges,
   wherein said delay circuit comprises a first MOS transistor and a second MOS transistor coupled to said input, and wherein said symmetry circuit comprises a first MOS transistor and a second MOS transistor coupled to said output,
   wherein said gain characteristic is determined by one of a ratio of a transconductance of said delay circuit first MOS transistor and said symmetry circuit second MOS transistor and a further ratio of a transconductance of said delay circuit second MOS transistor and said symmetry circuit first MOS transistor, and
   wherein said MOS transistors are sized to provide approximately equal gain for each of said ratios.

* * * * *